(12) United States Patent
Deeman et al.

(10) Patent No.: US 6,814,898 B1
(45) Date of Patent: Nov. 9, 2004

(54) IMPRINT LITHOGRAPHY UTILIZING ROOM TEMPERATURE EMBOSSING

(75) Inventors: Neil Deeman, Alamo, CA (US); Gennady Gauzner, Livermore, CA (US)

(73) Assignee: Seagate Technology LLC, Scotts Valley, CA (US)

( * ) Notice: Subject to any disclaimer, the term of this patent is extended or adjusted under 35 U.S.C. 154(b) by 226 days.

(21) Appl. No.: 09/966,105

(22) Filed: Oct. 1, 2001

Related U.S. Application Data
(60) Provisional application No. 60/241,418, filed on Oct. 17, 2000.

(51) Int. Cl.$^7$ ............................................... B29D 11/00
(52) U.S. Cl. ...................................... 264/1.33; 264/320
(58) Field of Search ........................ 264/1.1, 320, 1.31, 264/1.7, 338, 1.33; 216/44, 52, 53

(56) References Cited

U.S. PATENT DOCUMENTS 4,900,111 A * 2/1990 D'Amato et al.
5,279,689 A * 1/1994 Shvartsman
5,427,599 A * 6/1995 Greschner et al.

* cited by examiner

*Primary Examiner*—Mathieu D. Vargot
(74) *Attorney, Agent, or Firm*—McDermott, Will & Emery

(57) ABSTRACT

A method of performing imprint lithography of a surface of a workpiece including a substrate, wherein a stamper/imprinter comprised of a material having thermal expansion characteristics different from the material of said substrate is utilized for embossing a desired pattern in said workpiece surface, the method comprising conducting the embossing at room temperature in order to avoid deleterious effects arising from differences in thermal expansion/contraction characteristics between the stamper/imprinter and the workpiece which occur during conventional imprinting at elevated temperatures. Embodiments of the invention include forming servo patterns in disk-shaped substrates utilized in the manufacture of hard disk magnetic recording media.

20 Claims, 2 Drawing Sheets

IMPRINT LITHOGRAPHY UTILIZING ROOM TEMPERATURE EMBOSSING

CROSS-REFERENCE TO PROVISIONAL APPLICATION

This application claims priority from U.S. provisional patent application Ser. No. 60/241,418 filed Oct. 17, 2000, the entire disclosure of which is incorporated herein by reference.

CROSS-REFERENCE TO RELATED APPLICATION

This application contains subject matter similar to subject matter disclosed in co-pending U.S. patent application Ser. No. 09/946,939, filed on Sep. 06, 2001.

FIELD OF THE INVENTION

The present invention relates to methods and devices for forming submicron sized features and patterns in large area substrate surfaces by means of imprint lithography. The invention has particular utility in the formation of servo patterns in the surfaces of substrates utilized in the manufacture of data/information storage and retrieval media, e.g., hard disk magnetic media.

BACKGROUND OF THE INVENTION

Optical-based lithographic techniques are widely employed in the fabrication of integrated circuits (ICs) and other devices requiring very fine-dimensioned patterns or features. However, the constantly increasing demands of micro-miniaturization for increased data storage and computation require fabrication of devices with ever smaller dimensions, which demands tax or even exceed the limits of conventional optical lithographic patterning processes utilizing visible light. As a consequence, intense research has been conducted on ultra-violet (UV), X-ray, electron beam (e-beam), and scanning probe (SP) lithography. However, while each of these techniques is capable of providing high resolution, finely-dimensioned patterns and features, the economics of their use is less favorable, due to such factors as limitations arising from wavelength-dependent phenomena, slow e-beam and SP writing speeds, and difficulties in the development of suitable resist materials.

Thermal imprint lithography has been recently studied and developed as a low cost alternative technique for fine dimension pattern/feature formation in the surface of a substrate or workpiece, as for example, described in U.S. Pat. Nos. 4,731,155; 5,772,905; 5,817,242; 6,117,344; 6,165,911; 6,168,845 B1; 6,190,929 B1; and 6,228,294 B1, the disclosures of which are incorporated herein by reference. A typical thermal imprint lithographic process for forming nano-dimensioned patterns/features in a substrate surface is illustrated with reference to the schematic, cross-sectional views of FIGS. 1(A)–1(D).

Referring to FIG. 1(A), shown therein is a mold 10 (also known as a stamper or imprinter) including a main or support body 12 having upper and lower opposed surfaces, with a molding layer 14 (also referred to as an imprinting surface) formed on the lower opposed surface. As illustrated, molding layer 14 includes a plurality of features 16 having a desired shape or surface contour. A substrate or workpiece 18 carrying a thin film layer 20 on an upper surface thereof is positioned below, and in facing relation to the molding layer 14. Thin film layer 20, e.g., of polymethyl methacrylate (PMMA), may be formed on the substrate/workpiece surface by any appropriate technique, e.g., spin casting.

Adverting to FIG. 1(B), shown therein is a compressive molding step, wherein mold 10 is pressed into the thin film layer 20 in the direction shown by arrow 22, so as to form depressed, i.e., compressed, regions 24. In the illustrated embodiment, features 16 of the molding layer 14 are not pressed all of the way into the thin film layer 20 and thus do not contact the surface of the underlying substrate 18. However, the top surface portions 24a of thin film 20 may contact depressed surface portions 16a of molding layer 14. As a consequence, the top surface portions 24a substantially conform to the shape of the depressed surface portions 16a, for example, flat. When contact between the depressed surface portions 16a of molding layer 14 and thin film layer 20 occurs, further movement of the molding layer 14 into the thin film layer 20 stops, due to the sudden increase in contact area, leading to a decrease in compressive pressure when the compressive force is constant.

FIG. 1(C) shows the cross-sectional surface contour of the thin film layer 20 following removal of mold 10. The molded, or imprinted, thin film layer 20 includes a plurality of recesses formed at compressed regions 24 which generally conform to the shape or surface contour of features 16 of the molding layer 14. Referring to FIG. 1(D), in a next step, the surface-molded workpiece is subjected to processing to remove the compressed portions 24 of thin film 20 to selectively expose portions 28 of the underlying substrate 18 separated by raised features 26. Selective removal of the compressed portions 24 may be accomplished by any appropriate process, e.g., reactive ion etching (RIE), wet chemical etching, or ion or electron beam irradiation. The thuspatterned thin film layer 20 may subsequently be utilized as an etch mask or irradiation mask for selective removal of the exposed substrate portions 28, after which the patterned thin film layer 20 is itself selectively removed, leaving a patterned substrate 18.

The above-described imprint lithographic processing is capable of providing sub-micron-dimensioned features, as by utilizing a mold 10 provided with patterned features 16 comprising pillars, holes, trenches, etc., by means of e-beam lithography, RIE, or other appropriate patterning method. Typical depths of features 16 range from about 5 to about 500 nm, depending upon the desired lateral dimension. The material of the molding layer 14 is typically selected to be hard relative to the thin film layer 20, the latter typically comprising a thermoplastic material which is softened when heated. Thus, suitable materials for use as the molding layer 14 include metals, dielectrics, semiconductors, ceramics, and composite materials. Suitable materials for use as thin film layer 20 include thermoplastic polymers which can be heated to above their glass temperature, $T_g$, such that the material exhibits low viscosity and enhanced flow.

While nanoimprint lithographic techniques, such as described above, afford the possibility of a low-cost, mass manufacturing technology for fabrication of sub-100 nm structures, features, etc., for semiconductor ICs, integrated optical, magnetic, and mechanical devices, the problem of non-uniform replication and sticking of the thermoplastic polymer materials to the molding layer 14 when the latter is applied to a large-area substrate, e.g., as in the formation of servo patterns in 95 mm diameter disks used in hard disk drives, arising from differences in thermal expansion/contraction characteristics of the mold and substrate materials, has not heretofore been addressed.

For example, according to conventional practices in thermal imprint lithography, it is normal for the components of the imprinting system, i.e., substrate, resist layer, and mold or imprint tool (referred to in the art as a stamper/imprinter)

to undergo large thermal swings or cycling, e.g., within a range of about 100° C. The 100° C. increase in temperature experienced by the thin film resist layer, typically of a thermoplastic polymer, causes the viscosity to decrease and hence increase the fluid flow characteristics thereof, which in turn, allows accurate replication of the features of the stamper/imprinter surface. However, a significant problem associated with this technique when utilized in certain applications is the dissimilar thermal expansion/contraction characteristics of the molding and thin film resist layers due to their entirely different materials properties, which dissimilarity results in degradation of imprint quality, as by deformation of and/or damage to the replicated thin film resist layer after the imprinting process is completed, as further explained below.

Imprint lithography tools, variously termed molds, stampers, imprinters, masks, etc., conventionally have been fabricated by electroforming nickel (Ni) or copper (Cu) onto a master plate comprising a patterned photoresist, or by etching through a substrate, e.g., of silicon (Si), coated with a layer of patterned photoresist. The former technique is typically utilized in the replication of vinyl audio records and optical disks; whereas the latter technique has been utilized to fabricate tools having very small feature sizes, e.g., ~20 nm, by means of e-beam techniques. However, the thermal expansion/contraction characteristics of these materials are substantially and significantly different from those of either the glass, ceramic, glass-ceramic composite, or nickel-phosphorus coated aluminum (Al/Ni—P) substrates typically utilized in fabricating magnetic media for use in hard disk drives, which differences in thermal expansion/contraction characteristics disadvantageously result in the above-mentioned degradation in imprint quality, e.g., resist deformation, poor mold release (sticking) causing resist peeling, and damage leading to loss of dimensional integrity, pattern/feature definition, etc.

An approach for minimizing deleterious effects on imprint quality, etc., arising from mismatch of the thermal expansion/contraction properties of the stamper/imprinter and substrate/workpiece is disclosed in commonly assigned, co-pending U.S. patent application Ser. No. 09/946,939, which approach involves utilizing stamper/imprinters and substrate/workpieces having equal, or at least substantially similar, coefficients of thermal expansion/contraction. However, this approach has a drawback in that it is generally limited to use of identical materials for the stamper/imprinter and substrate/workpiece, effectively precluding use of significantly different materials therefor, e.g., a metal stamper/imprinter and a glass substrate/workpiece. Another drawback associated with thermal lithographic imprinting is the very long heating and cooling times required for performing the pattern embossing process, which disadvantageously results in correspondingly long cycles times (on the order of several minutes) and significantly increased cost when forming part of a high product throughput manufacturing process, e.g., manufacture of substrates for hard disk magnetic recording media.

In view of the above, there exists a need for improved methodology and means for performing imprint lithography which eliminate, or at least substantially reduce, the disadvantageous degradation of imprint quality associated with the use of imprinting tools and resist materials having different thermal expansion/contraction characteristics in thermal imprint processing. More specifically, there exists a need for an improved means and methodology for imprinting or embossing a pattern, e.g., a servo pattern, in a surface of a resist or other type relatively soft layer on the surface of a high modulus substrate for a data/information storage and retrieval medium, e.g., a hard disk magnetic recording medium, which substrate is comprised of a glass, ceramic, glass-ceramic composite, or metal-based material.

The present invention addresses and solves problems and difficulties such as degradation of replication quality due to resist deformation, peeling, and poor mold release, attendant upon the use of thermal imprint lithography for pattern definition in substrate/workpiece surfaces, such as in the fabrication of hard disk substrates with integrally formed servo patterns, while maintaining full capability with all aspects of conventional automated manufacturing technology for pattern formation by imprint lithography. Further, the methodology and means afforded by the present invention enjoy diverse utility in the imprint lithographic patterning of a variety of substrates and workpieces.

DISCLOSURE OF THE INVENTION

An advantage of the present invention is an improved method of performing imprint lithography.

Another advantage of the present invention is an improved method of forming a servo pattern in a surface of a substrate for a hard disk recording medium.

Yet another advantage of the present invention is an improved substrate for a hard disk magnetic recording medium including a servo pattern formed in a surface thereof.

Additional advantages and other aspects and features of the present invention will be set forth in the description which follows and in part will become apparent to those having ordinary skill in the art upon examination of the following or may be learned from the practice of the present invention. The advantages of the present invention may be realized and obtained as particularly pointed out in the appended claims.

According to an aspect of the present invention, the foregoing and other advantages are obtained in part by a method of performing imprint lithography of a surface of a workpiece including a substrate and a layer of an imprintable resist material, wherein a stamper/imprinter comprised of a material having thermal expansion characteristics different from the material of the substrate is utilized for embossing a desired pattern in the workpiece surface, the method comprising conducting the embossing at room temperature, whereby deleterious effects arising from differences in thermal expansion/contraction characteristics of the stamper/imprinter and workpiece are avoided.

In accordance with embodiments of the present invention, the stamper/imprinter comprises:

(a) a support body; and (b) an imprinting surface having a negative image of said desired pattern formed therein; and, according to particular embodiments of the invention, the support body (a) and the imprinting surface (b) of the stamper/imprinter are composed of the same material, e.g., a metal material, such as nickel (Ni); whereas, according to other particular embodiments of the present invention, the support body (a) and the imprinting surface (b) are composed of different materials, e.g., the imprinting surface (b) is made of silicon (Si) and the support body (b) is made of a metal. In either instance, according to the invention, the imprinting surface (b) has a negative image of a servo pattern for a recording medium formed therein, e.g., a negative image of a servo pattern for a disk-shaped magnetic recording medium; the workpiece includes a substrate for a hard disk magnetic recording medium, the substrate having a surface and comprising a material selected from the group consisting of glass, ceramics, glass-ceramics composites, polymers, metals, and metal alloys; the workpiece further includes a layer of an imprintable resist material overlying the substrate surface and presenting an exposed upper surface; and the servo pattern is embossed at room temperature in the exposed upper surface of the layer of resist material to form a servo-patterned resist layer.

According to embodiments of the present invention, the thickness of the layer of resist material is less than the depth of the features of the negative image of the servo pattern of the imprinting surface (b); and the method further comprises steps of selectively forming the servo pattern in the hard disk substrate material utilizing the servo-patterned resist layer as an etch mask or irradiation mask and selectively removing the servo-patterned resist layer subsequent to forming of the servo pattern in the hard disk substrate material.

Embodiments of the present invention include performing the room temperature embossing of the servo pattern in the layer of resist material comprising utilizing a press for high pressure urging of the imprinting surface of the stamper/imprinter against the exposed upper surface of the layer of resist material.

Another aspect of the present invention is a method of forming a servo pattern in the surface of a substrate for a magnetic recording medium, comprising the steps of:

(a) providing a workpiece including a substrate for a hard disk magnetic recording medium and a layer of an imprintable resist material overlying the substrate and having an exposed upper surface;

(b) providing a stamper/imprinter including an imprinting surface having a negative image of the servo pattern formed therein; and (c) utilizing the stamper/imprinter for performing room temperature embossing of the exposed upper surface of the layer of resist material with the negative image of the servo pattern.

According to embodiments of the present invention, the method further comprises the steps of:

(d) selectively forming the servo pattern in the hard disk substrate utilizing the servo-patterned layer of resist material as an etch mask or irradiation mask; and (e) selectively removing the servo-patterned layer of resist material subsequent to performing step (d).

In accordance with embodiments of the present invention, step (a) comprises providing a disk-shaped substrate comprising a material selected from the group consisting of glass, ceramics, glass-ceramics composites, polymers, metals, and metal alloys; and step (b) comprises providing a stamper/imprinter wherein at least the imprinting surface is comprised of a metal material.

According to particular embodiments, step (a) comprises providing a disk-shaped substrate comprised of glass or NiP-coated Al; and step (b) comprises providing a stamper/imprinter including an imprinting surface comprised of Ni.

In accordance with further embodiments of the present invention, step (a) comprises providing a workpiece including a resist layer having a thickness less than the depth of the features of the negative image of the servo pattern in the imprinting surface of the imprinter/stamper; and step (c) comprises performing room temperature embossing of the servo pattern utilizing a press for high pressure urging of the imprinting surface of the stamper/imprinter against the exposed upper surface of the layer of resist material.

Still another aspect of the present invention is a substrate for a hard disk magnetic recording medium, comprising a servo pattern formed in a surface thereof by a process comprising room temperature embossing of the servo pattern in a layer of an imprintable resist material overlying the substrate surface.

Additional advantages and aspects of the present invention will become readily apparent to those skilled in the art from the following detailed description, wherein embodiments of the present invention are shown and described, simply by way of illustration of the best mode contemplated for practicing the present invention. As will be described, the present invention is capable of other and different embodiments, and its several details are susceptible of modification in various obvious respects. Accordingly, the drawings and description are to be regarded as illustrative in nature, and not as limitative.

BRIEF DESCRIPTION OF THE DRAWINGS

The following detailed description of the embodiments of the present invention can best be understood when read in conjunction with the following drawings, in which the features are not necessarily drawn to scale but rather are drawn as to best illustrate the pertinent features, wherein.

DESCRIPTION OF THE INVENTION

The present invention addresses and solves problems attendant upon the use of stampers/imprinters and workpieces of different materials, hence different thermal expansion/contraction characteristics, when performing imprint lithography at elevated temperatures, e.g., nanoimprint lithography for forming submicron-dimensioned patterns and features in substrate surfaces utilized in various technologies such as semiconductor IC processing and magnetic recording media manufacture, and is based upon the discovery that degradation of pattern replication fidelity arising from resist damage, loss of dimensional accuracy, peeling, sticking, etc., can be eliminated, or at least minimized, so as to facilitate accurate, high quality replication of a desired feature or pattern in an imprintable layer, e.g., of a resist material, on a workpiece surface. According to a key feature of the present invention, imprinting of the pattern in a resist layer overlying a substrate of a workpiece is accomplished at room temperature, i.e., without thermal input, by means of a device, e.g., a hydraulic press, capable of urging the imprinting surface of the stamper/imprinter against the exposed upper surface of the imprintable resist layer with a sufficient force, e.g., ~20,000–40,000 lbs. onto a 95 mm diameter disk, such that the surface of the resist layer accurately conforms to the surface topography of the stamper/imprinter. As a consequence of the elimination of the thermal cycling between lower, higher, and lower temperatures associated with conventional thermal lithographic imprinting, the inventive methodology avoids, or at least minimizes, the above-described deleterious effects on replication fidelity associated with the differences in thermal expansion/characteristics of the stamper/imprinter and the workpiece arising from the different materials utilized for the former and the latter.

Figure 1:
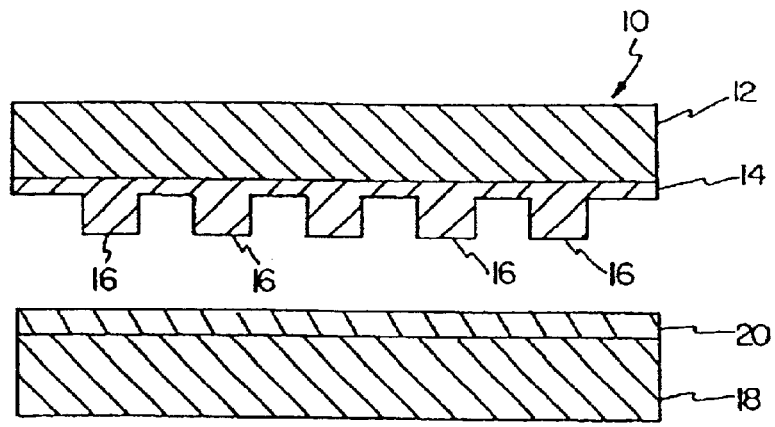
FIGS. 1(A)–1(D) are schematic, simplified cross-sectional views illustrating a process sequence for performing thermal imprint lithography of a thin resist film on a substrate (workpiece) according to the conventional art.
Figure 1:
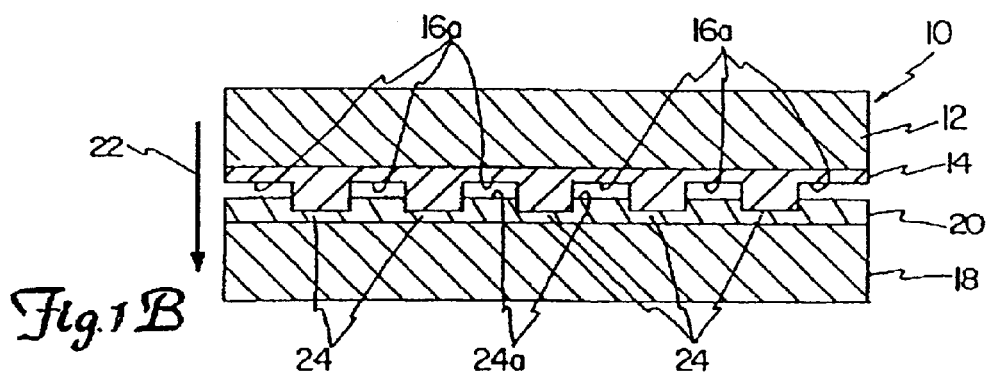
Figure 1:
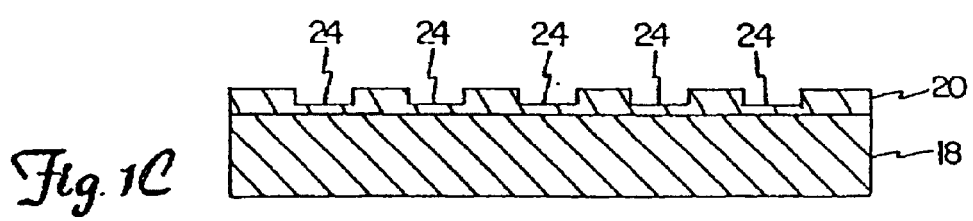
Figure 1:
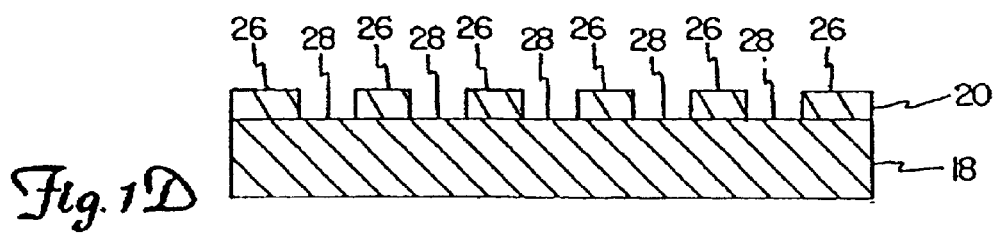
Figure 2:
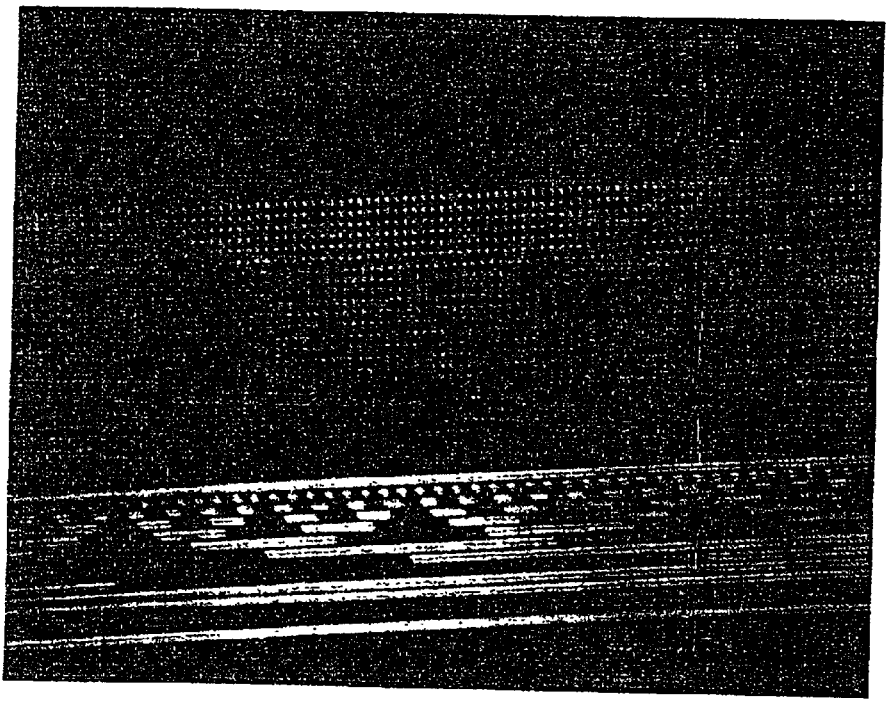
FIG. 2 is a photomicrograph of a resist-coated glass substrate imprinted with a servo pattern according to the room temperature process of the present invention.

According to an example illustrating the utility of the invention, a metal-based stamper/imprinter was utilized for forming a servo pattern in a disk-shaped glass substrate of a type typically employed as a substrate for a hard disk magnetic recording medium. According to this example, a 95 mm diameter glass disk substrate was spin-coated with an approximately 130 nm thick layer of an imprintable photoresist material (Shipley 1805) from approximately a 15. mm radius to the outer diameter, after which the resist-coated substrate was pre-baked at 90° C. for approximately 40 min. A metal-based stamper comprising a Ni imprinting surface having a negative image of a servo pattern for a disk-shaped magnetic recording medium formed therein was prepared. The feature ("format") height of the negative image servo pattern was greater than the thickness of the resist layer, i.e., about 160 nm. The patterned Ni imprinting surface of the stamper/imprinter and the resist-coated glass substrate (=workpiece) were assembled together on a flat, polished steel plate. A resilient (rubber) pad was placed on the back surface of the substrate and another flat, polished steel plate was placed over the back side of the stamper/imprinter. The sandwich-type assembly was then placed in a manually-actuated hydraulic press and a compressive force of about 20,000 lbs. was applied thereto for about 10 sec. The assembly with imprinted resist layer was then removed from the press and disassembled. Upon optical observation, the resist layer was determined to have a well-defined servo format pattern formed therein that replicated the negative image pattern of the imprinting surface of the stamper/imprinter with excellent fidelity, as is apparent from the photomicrograph of FIG. 2.

Figure 3:
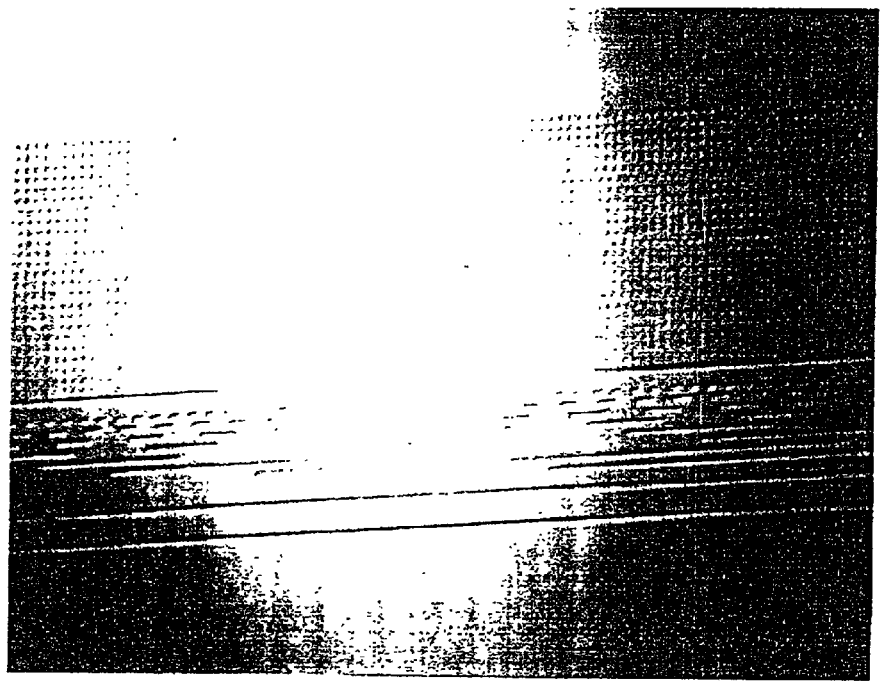
FIG. 3 is a photomicrograph of the servo-patterned glass substrate of FIG. 2 after reactive ion etching (RIE) of the glass substrate and resist removal.

The imprinted workpiece was then subjected to reactive ion etching (RIE) in a $CHF_3$/Ar atmosphere at 450 Watts power for about 15 minutes to selectively etch the servo format pattern into the glass substrate, using the servo-patterned photoresist layer as an etch (or irradiation) mask. The remaining photoresist after RIE was then removed by etching in a pure $O_2$ plasma at 200 Watts power for about 5 minutes. Examination of the thus-prepared servo-patterned glass disk under an optical microscope revealed that an excellent, high reproduction fidelity image of the servo format pattern was formed, i.e., with a track pitch of 710 nm and a minimum feature size of 590 nm×350 nm, as is apparent from the photomicrograph of FIG. 3.

According to another example illustrating the utility of the present invention, a metal-based stamper/imprinter was utilized for forming a servo pattern in a disk-shaped metal substrate of a type typically employed as a substrate for a hard disk magnetic recording medium. More specifically, according to this example, an 84 mm diameter NiP-coated Al disk substrate was spin-coated with an about 90 nm thick layer of an imprintable photoresist material (Shipley 1805). An assembly of the coated disk and a stamper/imprinter including a Ni imprinting surface having a negative image of a servo pattern for a disk-shaped magnetic recording medium formed therein was prepared as in the first example and placed in an automatic hydraulic press (Carver) for 10 sec. at approximately 40,000 lbs. applied compressive force. As before, the servo pattern of the imprinting surface was faithfully replicated in the imprintable resist layer in well-defined manner, after which the imprinted resist layer was utilized as an etch or irradiation mask for selectively forming the servo pattern in the underlying NiP/Al substrate, followed by removal of the residual resist layer.

Alternatively, the stamper/imprinter may comprise different materials, e.g., an imprinting surface made of a patterned silicon (Si) layer overlying a metal support body or layer. In such instance, the imprinting surface may be made of a material selected on the basis of its wear resistance, non-stick properties, and/or ease of surface patterning. The material of the imprinting surface, therefore, may be substantially different from that of the underlying support body or layer, the latter material being selected on the basis of economic considerations, e.g., low cost, and physical properties, e.g., mechanical robustness.

Thus, the inventive means and methodology provides for the performance of imprint lithography with improved replication fidelity and substantially reduced cycle times, i.e., on the order of about 10 sec., compared with cycle times of several minutes according to conventional thermal imprint lithographic processing at elevated temperatures. Further, the inventive methodology readily permits the use of stampers/imprinters and substrates/workpieces of different materials having substantially different thermal expansion/contraction characteristics, e.g., widely utilized stampers/imprinters with Ni imprinting surfaces can be readily employed for imprinting of glass and metal-based substrates/workpieces, e.g., Al-based substrates, such as are conventionally utilized in the fabrication of hard disk magnetic recording media.

Moreover, the inventive methodology is not limited to use as described above in the illustrative examples; rather, the invention can be practiced with a wide variety of substrates/workpieces, such as, for example, semiconductor substrates utilized in integrated circuit (IC) device manufacture, and the imprinted patterns capable of being formed by the invention are not limited to servo patterns for magnetic recording media, and may, for example, include metallization patterns of semiconductor IC devices.

In the previous description, numerous specific details are set forth, such as specific materials, structures, reactants, processes, etc., in order to provide a better understanding of the present invention. However, the present invention can be practiced without resorting to the details specifically set forth. In other instances, well-known processing materials and techniques have not been described in detail in order not to unnecessarily obscure the present invention.

Only the preferred embodiments of the present invention and but a few examples of its versatility are shown and described in the present disclosure. It is to be understood that the present invention is capable of use in other combinations and environments and is susceptible of changes and/or modifications within the scope of the inventive concept as expressed herein.

What is claimed is:

1. A method of performing imprint lithography of a surface of a workpiece including a substrate and a layer of an imprintable resist material, wherein a stamper/imprinter comprised of a material having thermal expansion characteristics different from the material of said substrate is utilized for embossing a desired pattern in the workpiece surface, the method comprising conducting said embossing at room temperature, whereby deleterious effects arising from differences in thermal expansion/contraction characteristics of the stamper/imprinter and workpiece are avoided, wherein said stamper/imprinter comprises:

(a) a support body; and (b) an imprinting surface having a negative image of a servo pattern for a recording medium formed therein.

2. The method according to claim 1, wherein:
said support body (a) and said imprinting surface (b) are composed of the same material.

3. The method according to claim 2, wherein:
said support body (a) and said imprinting surface (b) are composed of a metal material.

4. The method according to claim 3, wherein:
said metal material is nickel (Ni).

5. The method according to claim 1, wherein:
said support body (a) and said imprinting surface (b) are composed of different materials.

6. The method according to claim 5, wherein:
said imprinting surface (b) is made of silicon (Si).

7. The method according to claim 6, wherein:
said support body (a) is made of a metal.

8. The method according to claim 1, wherein:
said imprinting surface (b) has formed therein a negative image of a servo pattern for a disk-shaped magnetic recording medium.

9. The method according to claim 8, wherein said workpiece includes a substrate for a hard disk magnetic recording medium, said substrate having a surface and comprising a material selected from the group consisting of glass, ceramics, glass-ceramics composites, polymers, metals, and metal alloys.

10. The method according to claim 9, wherein said workpiece further includes said layer of imprintable resist material overlying said substrate surface and presenting an exposed upper surface, and said servo pattern is embossed at room temperature in said exposed upper surface of said layer of resist material to form a servo-patterned resist layer.

11. The method according to claim 10, wherein the thickness of said layer of resist material is less than the depth of the features of said negative image of said servo pattern of said imprinting surface (b).

12. The method according to claim 10, further comprising selectively forming said servo pattern in said hard disk substrate material utilizing said servo-patterned resist layer as an etch mask or irradiation mask.

13. The method according to claim 12, further comprising selectively removing said servo-patterned resist layer subsequent to said forming of said servo pattern in said hard disk substrate material.

14. The method according to claim 10, wherein said room temperature embossing of said servo pattern in said layer of resist material comprises utilizing a press for high pressure urging of said imprinting surface of said stamper/imprinter against said exposed upper surface of said layer of resist material.

15. A method of forming a servo pattern in the surface of a substrate for a magnetic recording medium, comprising the steps of:

(a) providing a workpiece including a substrate for a hard disk magnetic recording medium and a layer of an imprintable resist material overlying said substrate and having an exposed upper surface;

(b) providing a stamper/imprinter including an imprinting surface having a negative image of said servo pattern formed therein; and (c) utilizing said stamper/imprinter for performing room temperature embossing of said exposed upper surface of said layer of resist material with said negative image of said servo pattern.

16. The method according to claim 15, further comprising the steps of:

(d) selectively forming said servo pattern in said hard disk substrate utilizing the servo-patterned layer of resist material as an etch mask or irradiation mask; and (e) selectively removing said servo-patterned layer of resist material subsequent to performing step (d).

17. The method according to claims 15, wherein:
step (a) comprises providing a disk-shaped substrate comprising a material selected from the group consisting of glass, ceramics, glass-ceramics composites, polymers, metals, and metal alloys; and
step (b) comprises providing a stamper/imprinter wherein at least said imprinting surface is comprised of a metal material.

18. The method according to claim 17, wherein:
step (a) comprises providing a disk-shaped substrate comprised of glass or NiP-coated Al; and
step (b) comprises providing a stamper/imprinter including an imprinting surface comprised of Ni.

19. The method according to claim 15, wherein:
step (a) comprises providing a workpiece including a resist layer having a thickness less than the depth of the features of said negative image of said servo pattern in said imprinting surface of said imprinter/stamper.

20. The method according to claim 15, wherein:
step (c) comprises performing room temperature embossing of said servo pattern utilizing a press for high pressure urging of said imprinting surface of said stamper/imprinter against said exposed upper surface layer of resist material.

* * * * *